(12) United States Patent
Jang et al.

(10) Patent No.: US 8,843,811 B2
(45) Date of Patent: Sep. 23, 2014

(54) APPARATUS AND METHOD FOR DECODING IN COMMUNICATION SYSTEM

(75) Inventors: Min-Ho Jang, Seoul (KR); Hee-Won Kang, Seongnam-si (KR); Seung-Hyun Kwak, Suwon-si (KR); Pil-Sung Kwon, Seoul (KR); Jae-dong Yang, Suwon-si (KR); Young-Kwan Choi, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 85 days.

(21) Appl. No.: 13/371,706

(22) Filed: Feb. 13, 2012

(65) Prior Publication Data

US 2012/0210197 A1 Aug. 16, 2012

(30) Foreign Application Priority Data

Feb. 15, 2011 (KR) .................. 10-2011-0013160

(51) Int. Cl.
*H03M 13/03* (2006.01)
*H03M 13/41* (2006.01)
*H04L 1/00* (2006.01)

(52) U.S. Cl.
CPC ........... *H04L 1/0054* (2013.01); *H03M 13/413* (2013.01); *H03M 13/4169* (2013.01); *H03M 13/4138* (2013.01)
USPC ........................................................ 714/792

(58) Field of Classification Search
CPC .............. H03M 13/41; H03M 13/256; H03M 13/4107; H03M 13/2993; H03M 13/2996; H03M 13/299; H03M 13/395; H03M 13/3955; H03M 13/3994; H03M 13/258; H03M 13/3972; H03M 7/3086; H03M 13/4123; H03M 13/2957; H03M 13/296; H03M 13/2963; H03M 13/2969; H03M 13/4153; G06F 11/07; H04L 1/006; H04L 1/0054
See application file for complete search history.

(56) References Cited

U.S. PATENT DOCUMENTS 4,868,830 A * 9/1989 Pollara-Bozzola ........... 714/794
5,493,586 A * 2/1996 Brownlie et al. ............. 375/265

(Continued)

FOREIGN PATENT DOCUMENTS

JP 7-212336 A 8/1995
JP 2001-506811 A 5/2001

(Continued)

OTHER PUBLICATIONS

Rami A. Abdallah et al., Low-power pre-decoding based viterbi decoder for tail-biting convolutional codes, Signal Processing Systems, 2009. SiPS 2009. IEEE Workshop on, Oct. 9, 2009, pp. 185-190.

(Continued)

*Primary Examiner* — Albert Decady
*Assistant Examiner* — Enamul M Kabir
(74) *Attorney, Agent, or Firm* — Jefferson IP Law, LLP (57) ABSTRACT

An apparatus and a method for decoding bits of a received signal in a communication system are provided. The method includes determining path metrics of respective states in a trellis corresponding to the received signal, selecting a start state in the trellis for a traceback in a last window of the trellis, repeating the traceback at least twice within the last window, and when the repeating of the traceback is completed, determining the decoded bits of the received signal using a survived path of a last traceback.

22 Claims, 9 Drawing Sheets

(56) References Cited

U.S. PATENT DOCUMENTS

| | | | |
|---|---|---|---|
| 5,533,065 A * | 7/1996 | Blaker et al. | 375/341 |
| 5,920,597 A * | 7/1999 | Khayrallah et al. | 375/265 |
| 6,452,979 B1 * | 9/2002 | Ariel et al. | 375/265 |
| 6,591,395 B1 * | 7/2003 | Tsai | 714/795 |
| 6,829,313 B1 * | 12/2004 | Xu | 375/341 |
| 6,868,132 B1 * | 3/2005 | Classon et al. | 375/341 |
| 6,901,117 B1 * | 5/2005 | Classon et al. | 375/341 |
| 7,487,430 B2 * | 2/2009 | Kim et al. | 714/779 |
| 2001/0019576 A1 * | 9/2001 | Nystrom et al. | 375/136 |
| 2003/0007580 A1 * | 1/2003 | Nagata et al. | 375/341 |
| 2005/0094748 A1 * | 5/2005 | Zaboronski et al. | 375/341 |
| 2005/0182999 A1 * | 8/2005 | Rudosky et al. | 714/796 |
| 2006/0168502 A1 * | 7/2006 | Prasad et al. | 714/796 |
| 2008/0092025 A1 * | 4/2008 | Hedayat et al. | 714/792 |
| 2009/0103659 A1 * | 4/2009 | Chen et al. | 375/341 |
| 2010/0095189 A1 * | 4/2010 | Park et al. | 714/794 |
| 2011/0235757 A1 * | 9/2011 | Wong et al. | 375/341 |
| 2012/0030536 A1 * | 2/2012 | Fisher-Jeffes et al. | 714/755 |

FOREIGN PATENT DOCUMENTS

| | | |
|---|---|---|
| JP | 2004-260391 A | 9/2004 |
| JP | 2005-294898 A | 10/2005 |
| JP | 2011-501612 A | 1/2011 |

OTHER PUBLICATIONS

Antonio Valdovinos et al., Evaluation of a Reduced Complexity ML Decoding Algorithm for Tailbiting Codes on Wireless Systems, Vehicular Technology Conference Fall(VTC 2010-Fall), 2010 IEEE 72nd, Sep. 9, 2010.

* cited by examiner

APPARATUS AND METHOD FOR DECODING IN COMMUNICATION SYSTEM

PRIORITY

This application claims the benefit under 35 U.S.C. §119 (a) of a Korean patent application filed in the Korean Intellectual Property Office on Feb. 15, 2011 and assigned Serial No. 10-2011-0013160, the entire disclosure of which is hereby incorporated by reference.

BACKGROUND OF THE INVENTION

1. Field of the Invention

Aspects of the present invention relate generally to a communication system.

2. Description of the Related Art

When data is transmitted and received via a wireless signal in a wireless digital communication system, information is subject to external distortion and interference due to other wireless signals and Electromagnetic Interference (EMI). In order to recover the wireless signal from the external distortion and interference with high reliability, an error correction coding technique is utilized. Based on a channel code generation method, the error correction coding technique is classified largely into two types of techniques, that is, into algebraic codes such as Bose-Chaudhuri-Hocquenghem (BCH) codes and Reed-Solomon (RS) codes, and bipartite graph codes of tree structures, such as convolutional codes, turbo codes, and Low-Density Parity-Check (LDPC) codes.

The codes of the tree structure feature a relatively simple structure and provide excellent performance for an iterative decoding algorithm, and thus are estimated to be highly appropriate for real-time decoding of high-capacity and high-speed data. However, a Tail-Biting Convolutional Code (TBCC) is adopted as a standard in a great number of communication systems on account of TBCC's simple structure and excellent error correction performance. In a recent Institute of Electrical and Electronics Engineers (IEEE) standard for the 802.16m system, the TBCC is discussed as an error correction code for a control channel. For example, the TBCC is applied to a Secondary Fast Feedback Channel (S-FBCH) and a BandWidth REQuest CHannel (BW-REQCH) of uplink control channels of the IEEE 802.16m system. Convolutional coding is a representative channel coding scheme used to correct errors in many communication systems. Naturally, a lot of standardized modem chips are developed in order to implement the convolutional coding, and the technology is now well developed. Hence, there is a need to develop an algorithm for efficiently decoding the TBCC code using the related-art modem.

The techniques for the decoding of the convolutional code and the decoding of the TBCC code include a survived path search for calculating branch metrics in the trellis, and their respective core operations are generally identical. However, a difference between the decoding of the respective codes lies in that the TBCC decoding determines whether a start state and an end state are identical after the decoding is performed in a trellis diagram. However, a related-art convolutional decoding merely starts the traceback from the zero state, rather than starting the traceback from a maximum path metric. Accordingly, the TBCC coding may not be supported until related-art modem designs are modified so as to decode the TBCC code. Accordingly, a new traceback algorithm for decoding the TBCC code so as to reduce a memory complexity of a decoder for the related-art convolutional code and to reuse core block of the decoder is needed.

SUMMARY OF THE INVENTION

Aspects of the present invention are to address at least the above-mentioned problems and/or disadvantages and to provide at least the advantages described below Accordingly, an aspect of the present invention is to provide an apparatus and a method for reducing memory complexity of a decoder in a communication system.

Another aspect of the present invention is to provide an apparatus and a method for enhancing decoding reliability in a communication system.

Yet another aspect of the present invention is to provide an apparatus and a method for reducing an amount of information stored for traceback which is one of decoding processes in a communication system.

Still another aspect of the present invention is to provide an apparatus and a method for decoding using iterative traceback within a limited range of a communication system.

In accordance with an aspect of the present invention, a method for decoding bits of a received signal in a communication system is provided. The method includes determining path metrics of respective states in a trellis corresponding to the received signal, selecting a start state in the trellis for a traceback in a last window of the trellis, repeating the traceback at least twice within the last window, and determining the decoded bits of the received signal using a survived path of a last traceback after the repeating of the traceback is completed.

In accordance with another aspect of the present invention, an apparatus for decoding bits of a received signal in a communication system is provided. The apparatus includes a calculator for determining path metrics of respective states in a trellis corresponding to the received signal, a tracer for selecting a start state in the trellis for a traceback in a last window of the trellis, and repeating the traceback at least twice within the last window, and a determiner for, determining the decoded bits of the received signal using a survived path of a last traceback after the repeating of the traceback is completed.

Other aspects, advantages, and salient features of the invention will become apparent to those skilled in the art from the following detailed description, which, taken in conjunction with the annexed drawings, discloses exemplary embodiments of the invention.

BRIEF DESCRIPTION OF THE DRAWINGS

The above and other aspects, features, and advantages of certain exemplary embodiments of the present invention will be more apparent from the following description taken in conjunction with the accompanying drawings, in which.

Throughout the drawings, like reference numerals will be understood to refer to like parts, components and structures.

DETAILED DESCRIPTION OF EXEMPLARY EMBODIMENTS

The following description with reference to the accompanying drawings is provided to assist in a comprehensive understanding of exemplary embodiments of the invention as defined by the claims and their equivalents. It includes various specific details to assist in that understanding but these are to be regarded as merely exemplary. Accordingly, those of ordinary skill in the art will recognize that various changes and modifications of the embodiments described herein can be made without departing from the scope and spirit of the invention. In addition, descriptions of well-known functions and constructions may be omitted for clarity and conciseness.

The terms and words used in the following description and claims are not limited to the bibliographical meanings, but, are merely used by the inventor to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

By the term "substantially" it is meant that the recited characteristic, parameter, or value need not be achieved exactly, but that deviations or variations, including for example, tolerances, measurement error, measurement accuracy limitations and other factors known to those of skill in the art, may occur in amounts that do not preclude the effect the characteristic was intended to provide.

The exemplary embodiments of present invention relate to an apparatus and a method for decoding in a communication system. The exemplary embodiments of the present invention provide a decoding technique for reducing memory complexity and achieving high reliability. That is, the exemplary embodiments of the present invention provide a traceback algorithm for reducing a memory complexity in decoding by applying a new algorithm to a traceback process using a survived metric, and enhancing reliability of information recovery or reducing the memory complexity such that reliability is similar to that of the related-art algorithms.

Tail-Biting Convolutional Code (TBCC) is used as an error correcting code in a variety of communication systems on account of the TBCC having excellent error correcting capability and easy implementation. In the traceback process, which is a decoding processes of a convolutional decoder, the TBCC has a start state and an end state that are identical in a trellis. The TBCC may be decoded using a Soft Output Viterbi Algorithm (SOVA) based on a Log-Likelihood Ratio (LLR) message in the trellis.

In other words, the decoding according to an exemplary embodiment of the present invention includes selecting a maximum path metric, iterating an L-length traceback as many times as a number of windows according to a survival path from a state of the maximum path metric in the L-length last window in the trellis, detecting decoded bits, and determining whether the start state and the end state are identical so as to increase a reliability the decoding. In doing so, when the last reliability test result is not satisfactory, the decoder ignores the received message or determines that there is no received message. Hence, an error rate is not increased and consequently the reliability of the data recovery is enhanced.

The decoding according to another exemplary embodiment of the present invention includes selecting the maximum path metric through the decoding, iterating the L-length traceback as many times as the number of the windows according to the survival path from the state of the maximum path metric in the L-length last window in the trellis, detecting decoded bits, and determining whether the start state and the end state are identical in the trellis.

Before explaining the traceback algorithm, a Viterbi decoding process, which is the decoding process of the convolutional code, is described for the purpose of ease of understanding.

The Viterbi decoding goes through several operations, including: 1) a Branch Metric Calculation (BMC); 2) a path metric calculation; 3) an Add-Compare-Select (ACS) operation; 4) a storing of a survived path; 5) searching of a path metric; and 6) a traceback operation. Thus, through the above noted processes and operations, the path of the maximum path metric in the decoding process in the trellis, that is, a codeword, is determined as data transmitted from a transmitting stage. Hence, the maximum path metric can be referred to as a survived path metric. In the TBCC decoding, the exemplary embodiments of the present invention use the maximum path metric as the start state of the traceback algorithm. The decoding according to the exemplary embodiments of the present invention is described below.

First, a selection of a maximum path metric is described. Data transmitted from a transmitting stage, i.e., a transmitter, are received at a receiving stage, i.e., a receiver, over a channel of the wireless communication system. The receiving stage generates soft-output receive data, which is referred to as soft data. Based on the soft data, the receiving stage can calculate received signal LLRs. The TBCC decoder of the receiving stage may restore the data transmitted from the transmitting stage using the received signal LLRs using the SOYA. That is, the SOYA can efficiently and systematically realize a type of a correlator function which determines a similarity between the received data and transmittable codeword candidates. The SOYA algorithm is applied to the traceback process in the trellis so as to restore the information, and thus, to restore the information with a high reliability or to reuse the existing modem chip. This algorithm can be implemented using an existing structure of a modem chip without further modifying the modem chip structure, and thus, is very useful to realize the TBCC decoder.

Next, an iterative traceback algorithm is described. According to a traceback algorithm of the exemplary embodiment of the present invention, the decoder iterates a length-L traceback as many times as a number of the windows according to the survived path from the state of the maximum path metric within the length-L last window in the trellis. Since the survived path is iteratively searched only within the last window, there is no need to store information required to search for the survived path in other windows that are not the last window. Thus, an amount of memory needed is an inverse multiple of the number of related-art windows, for example, 1/4 or 1/6 times.

The exemplary embodiment of the present invention operates according to an assumption that the LLR values are fully accumulated and thus a reliability of the path metric of the last window is high. That is, it is more efficient to search for a state through the traceback having high reliability in terms of information reliability, rather than searching for the survived path in the initial window. Yet, for reliable information recovery, since a Trace Back Depth (TBD), which is approximately five times a constraint length K, is typically used, it is advantageous that a traceback window size is greater than 5K. Hence, a 4L or 6L window size is used according to a length of information L. For more clarity, a related-art traceback and a traceback according to the present exemplary embodiment are compared below.

Figure 1:
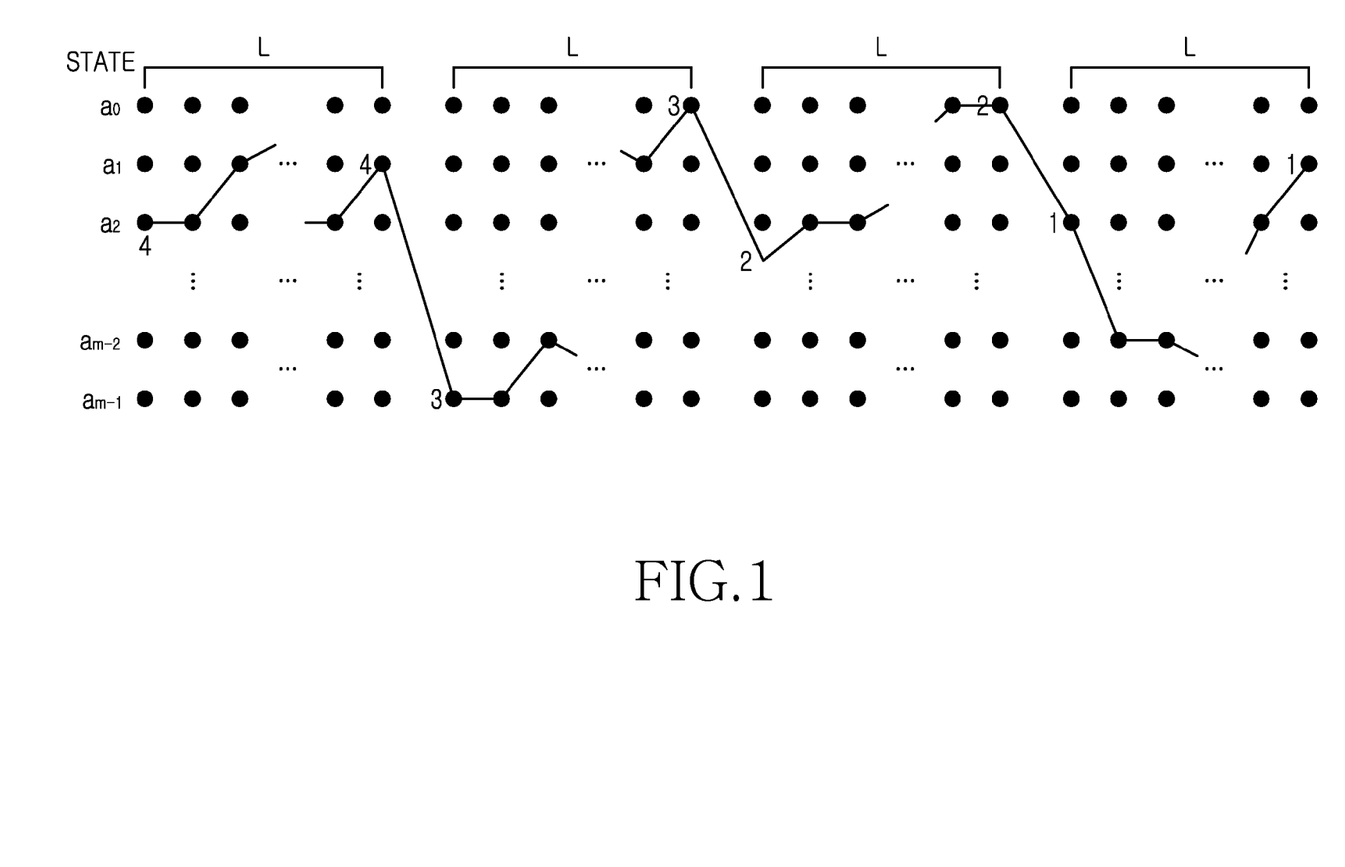
FIG. 1 illustrates a traceback process in a wireless communication system according to the related art.

FIG. 1 depicts a traceback process in a wireless communication system according to the related art. Referring to FIG. 1, there are m-ary states, a0 through am-1, and a window size is L. A line interconnecting the states indicates a survived path. Herein, a number of the states can be determined by a number of shift registers used by the transmitting stage for the coding. The traceback proceeds from the last window to the initial window as shown in FIG. 1.

Figure 2A:
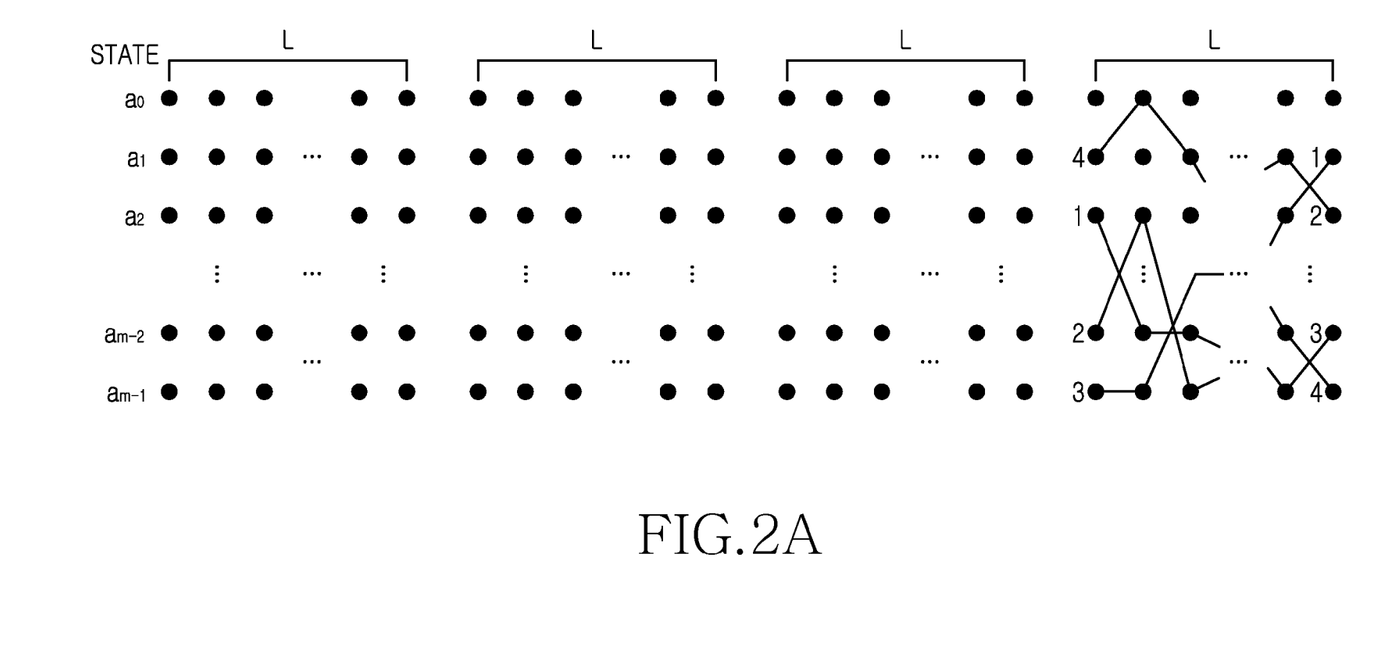
FIGS. 2A and 2B illustrate a traceback process in a wireless communication system according to an exemplary embodiment of the present invention.
Figure 2B:
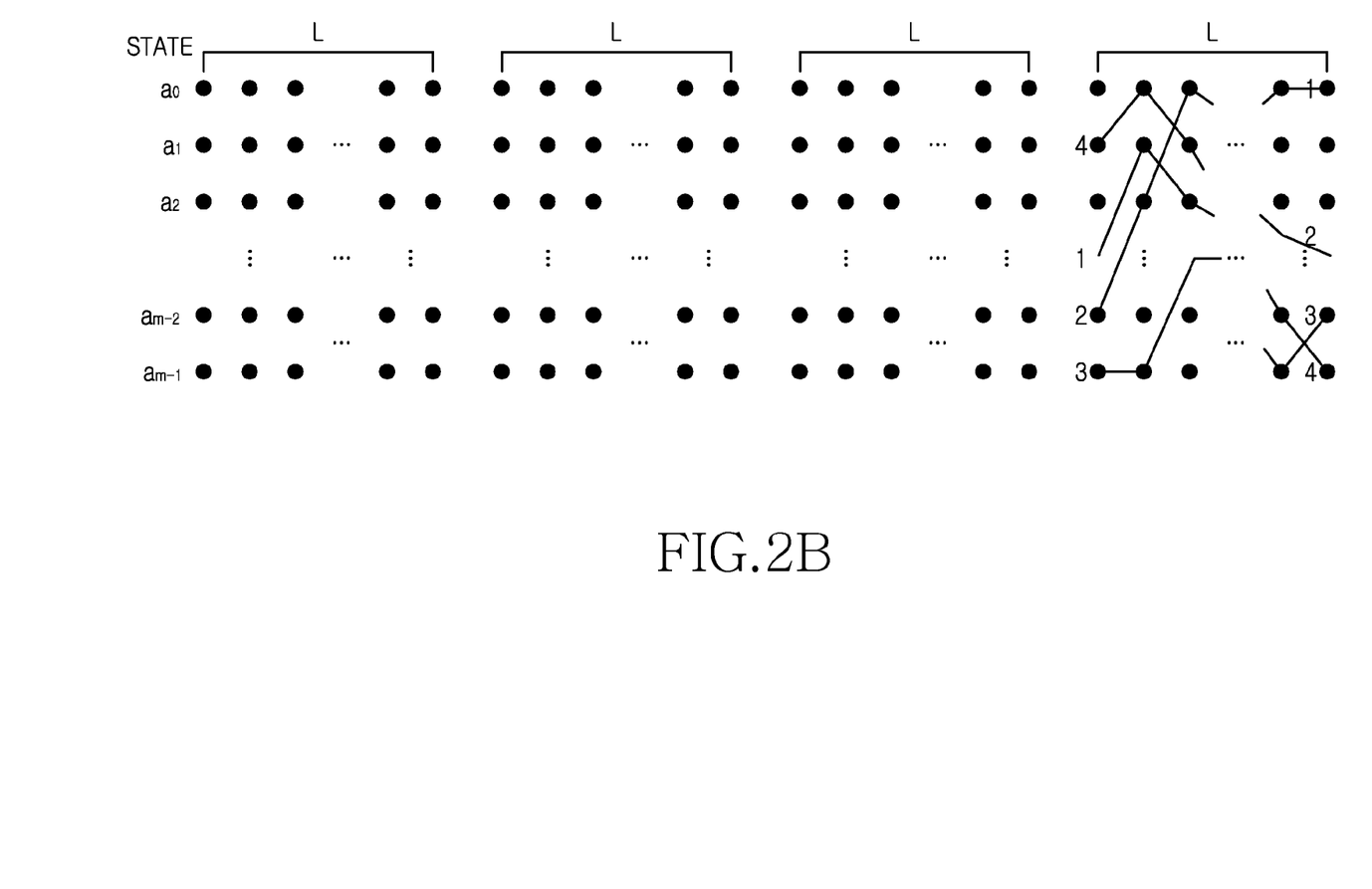

FIGS. 2A and 2B depict a traceback process in a wireless communication system according to an exemplary embodiment of the present invention.

Referring to FIGS. 2A and 2B, there are m-ary states, a0 through am-1, and the window size is L. A line interconnecting the states indicates the survived path. The traceback is iterated in the last window, as shown in FIGS. 2A and 2B. Referring to FIG. 2A, a first traceback starting from a1 ends at a2, and repeats from a2 in the last window. A second traceback ends at am-2 and repeats from am-2 in the last window. A third traceback ends at am-1 and repeats from am-1 in the last window. Hence, the final state is a1. In FIG. 2A, a start state of the traceback has the maximum path metric. In contrast, in FIG. 2B, a start state of the traceback is a0 regardless of the maximum path metric.

Next, a detecting of the decoded bits is described. In the iterative traceback process, the decoded bits are determined in the last traceback. That is, the decoded bits are determined according to values of the states selected as the survived path in the last traceback having the length L. In other words, the decoded bits are determined by a combination of the current state value and the previous state value of each branch in the survived path.

Next, a determination as to whether the start state and the end state are identical is described. Using a unique feature of the TBCC, that being that a start state and an end state of the survived path are identical, an additional reliability test may be performed. When the start state and the end state of the survived path are not identical, the decoder determines the occurrence of and reports the decoding failure, thus enhancing the reliability of other data.

Figure 3:
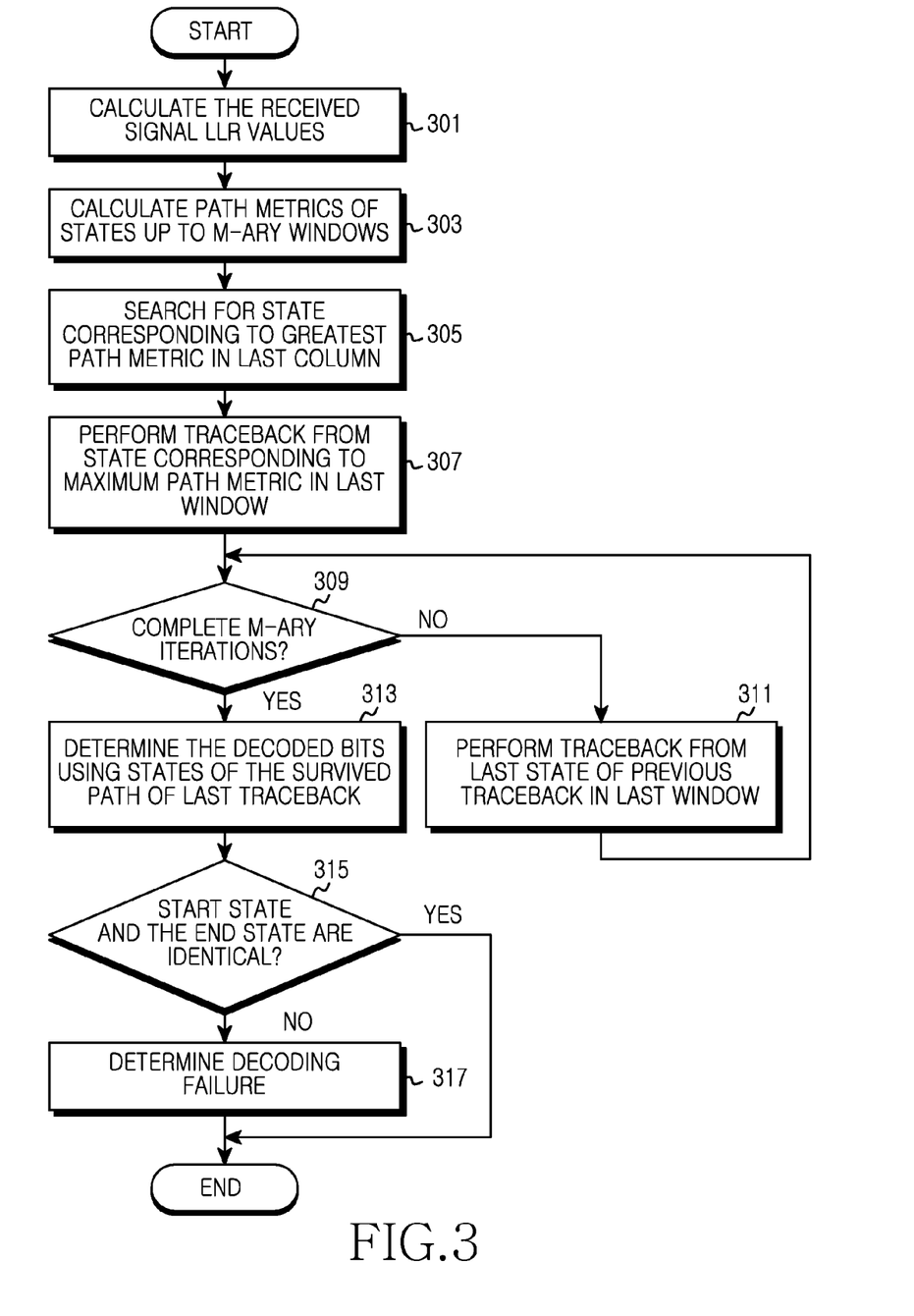
FIG. 3 illustrates operations of a receiving stage in a wireless communication system according to an exemplary embodiment of the present invention.

FIG. 3 illustrates operations of a receiving stage in a wireless communication system according to an exemplary embodiment of the present invention.

In step 301, the receiving stage calculates received signal LLR values. That is, the receiving stage generates soft data of the received signal by demodulating the received signal, and calculates bit-wise LLR values from the soft data by taking account of a channel condition.

In step 303, the receiving stage calculates path metrics of each of the states up to the m-ary windows. That is, the receiving stage calculates the path metric of each state using the bit-wise LLR values. The path metric may be an accumulated value of the branch metrics up to a corresponding state of a corresponding column of the trellis. The branch metric is a value indicating similarity between a codeword candidate of a corresponding branch and the bit-wise LLR values of a received codeword. For example, the branch metric may be a scalar value of the vector dot product between the codeword candidate and the bit-wise LLR values of the received codeword. At this time, the receiving stage stores information used to search for the survived path through the traceback. The information used for the survived path search is stored with respect to each state. Yet, the receiving stage only stores the information of the states of the last window. That is, the receiving stage discards information of the states of at least one other window that is not the last window. The information may be discarded by overwriting a limited memory space. For example, the information used for the survived path search may include at least one of the path metric, a traceback bit, and a quality indication bit of the path metric.

In step 305, the receiving stage searches for a state corresponding to the greatest path metric in the last column of the trellis. The present exemplary embodiment assumes that the codeword candidate of the corresponding branch and the bit-wise LLR values of the received codeword are more similar as the branch metric value increases. Hence, the receiving stage searches for the state corresponding to the maximum path metric. Alternatively, when the codeword candidate of the corresponding branch and the bit-wise LLR values of the received codeword are more similar as the branch metric value decreases, the receiving stage can search for the state corresponding to a minimum path metric.

In step 307, the receiving stage performs the traceback from the state corresponding to the maximum path metric in the last window. That is, the receiving stage applies the traceback to the L-ary columns starting from the start of the maximum path metric in the last column. The receiving stage selects the state corresponding to the maximum path metric as a start state in the last window, and then conducts the length-L traceback. The traceback is carried out using the information stored in a manner corresponding to each state.

In step 309, the receiving stage determines whether the M-ary traceback iterations are completed. That is, the receiving stage determines whether the length-L traceback is repeated as many times as the number of m-ary windows used for calculating the path metric in step 303. Namely, the receiving stage determines whether to determine the decoded bits because the m-ary traceback iterations are completed.

When the m-ary traceback iterations are not completed, the receiving stage performs the traceback from the last state of the previous traceback in the last window in step 311. That is, the receiving stage applies the traceback to the L-ary columns starting from the last state of the previous traceback in the last column. The receiving stage repeats the length-L traceback within the last window. The traceback is carried out using the information stored in a manner corresponding to each state.

In contrast, upon completing the m-ary traceback iterations, the receiving stage determines the decoded bits using the states of the survived path of the last traceback in step 313. That is, the receiving stage determines the decoded bits according the values of the states selected as the survived path in the M-th traceback.

In step 315, the receiving stage determines whether the start state and the end state are identical. In other words, the receiving stage determines whether the state of the maximum path metric, as searched in step 305, is identical to the end state of the M-th traceback. When the start state and the end state are identical, the receiving stage recognizes that the decoding has been successfully performed, and terminates the process of FIG. 3.

However, when the start state and the end state are not identical, then in step 317, the receiving stage determines that a decoding failure has occurred. Thus, the receiving stage may discard the corresponding codeword or provide notification that the decoding failure occurred.

In the exemplary embodiment of FIG. 3, the receiving stage searches for the state corresponding to the maximum path metric in step 305 and performs the traceback from the state corresponding to the maximum path metric in step 307. Alternatively, it is possible to use an encoder designed to always select a state '0' as a start state. In such a case, step 305 is omitted and step 307 may be replaced by a traceback from the state '0'.

The decoding method based on the TBCC has been described. However, the present invention is not limited thereto, and the method of FIG. 3 may be applied to decode a convolutional code according to other various methods, such as a case wherein steps 315 and 317 may be omitted.

Figure 4:
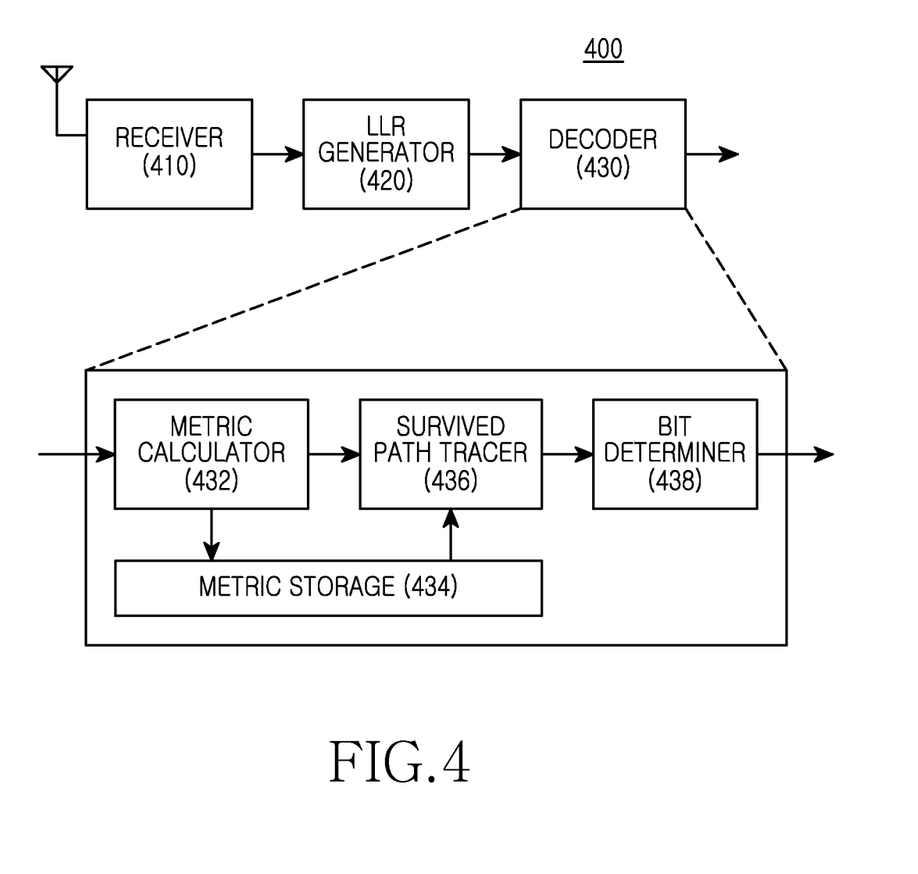
FIG. 4 illustrates a receiving stage in a wireless communication system according to an exemplary embodiment of the present invention.
Figure 5A:
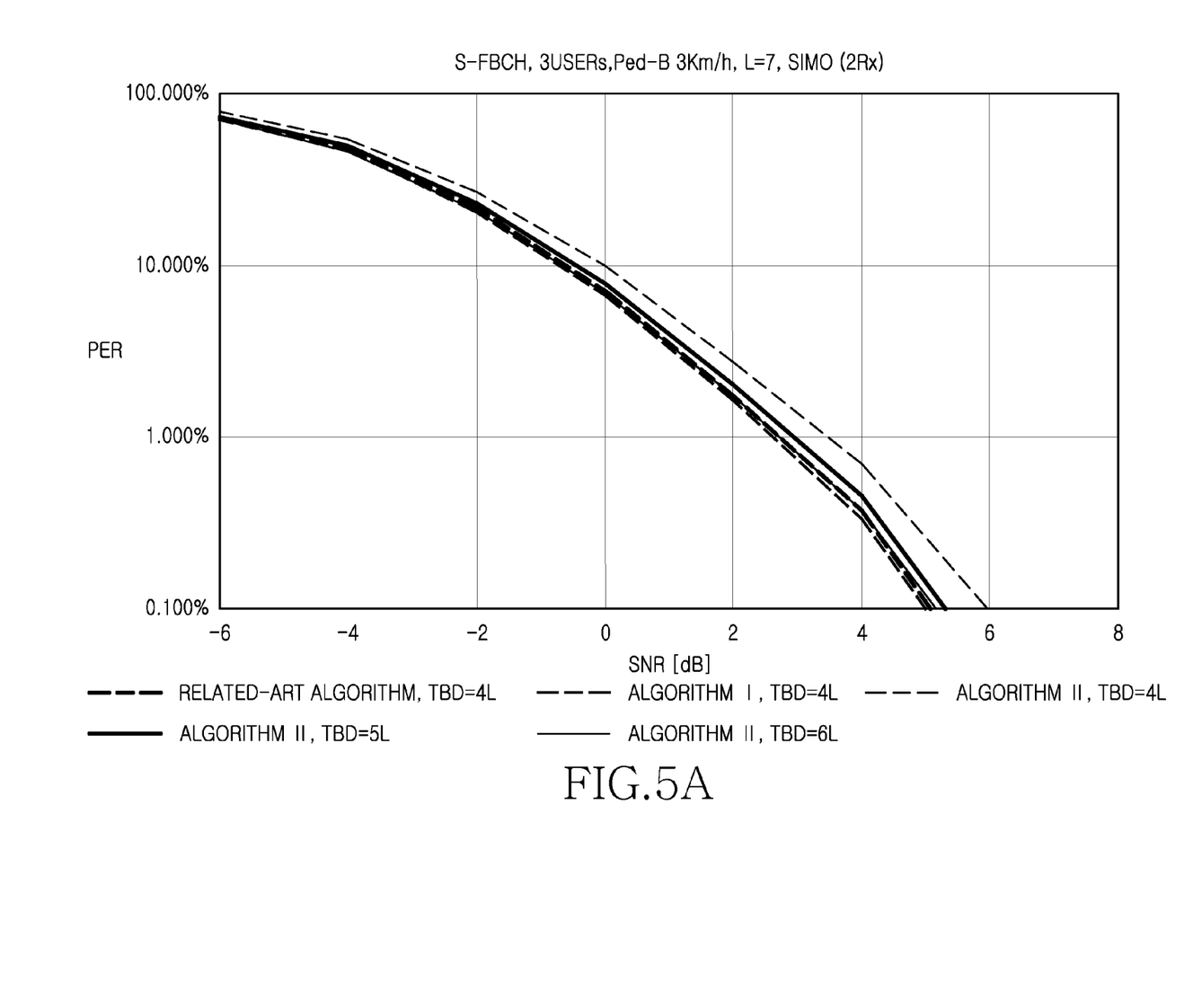
FIGS. 5A through 5D illustrate a decoding performance in a wireless communication system according to an exemplary embodiment of the present invention.
Figure 5B:
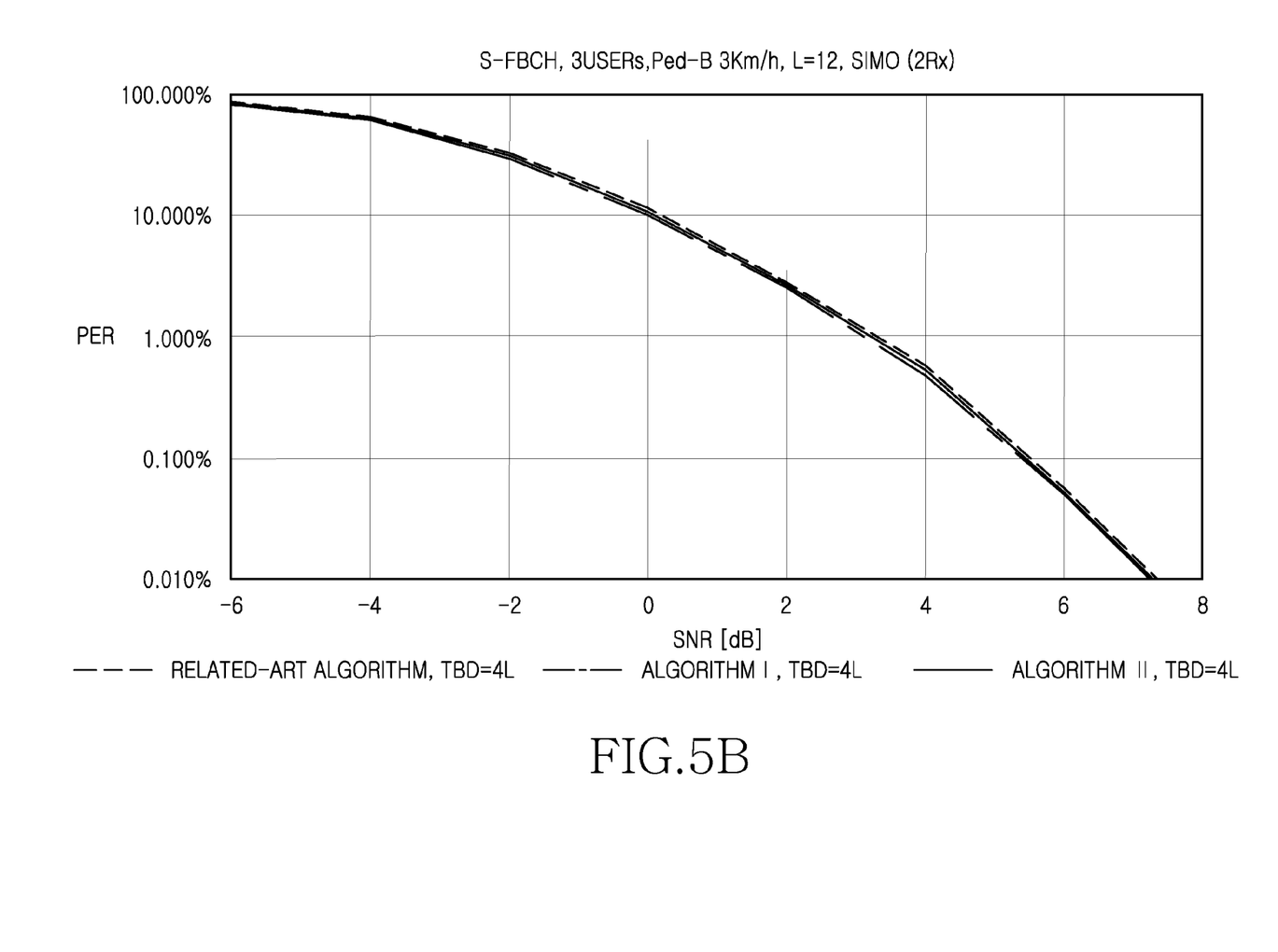
Figure 5C:
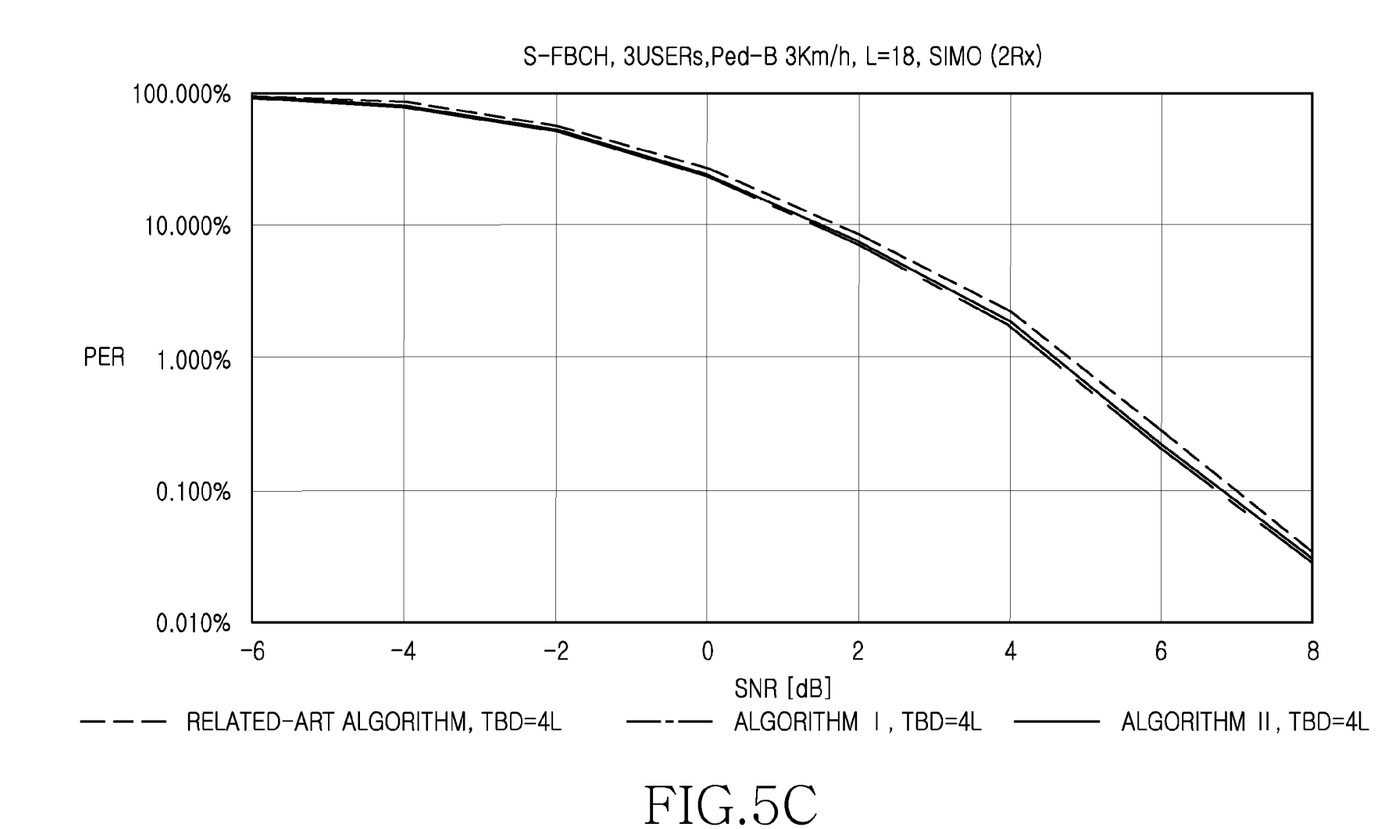
Figure 5D:
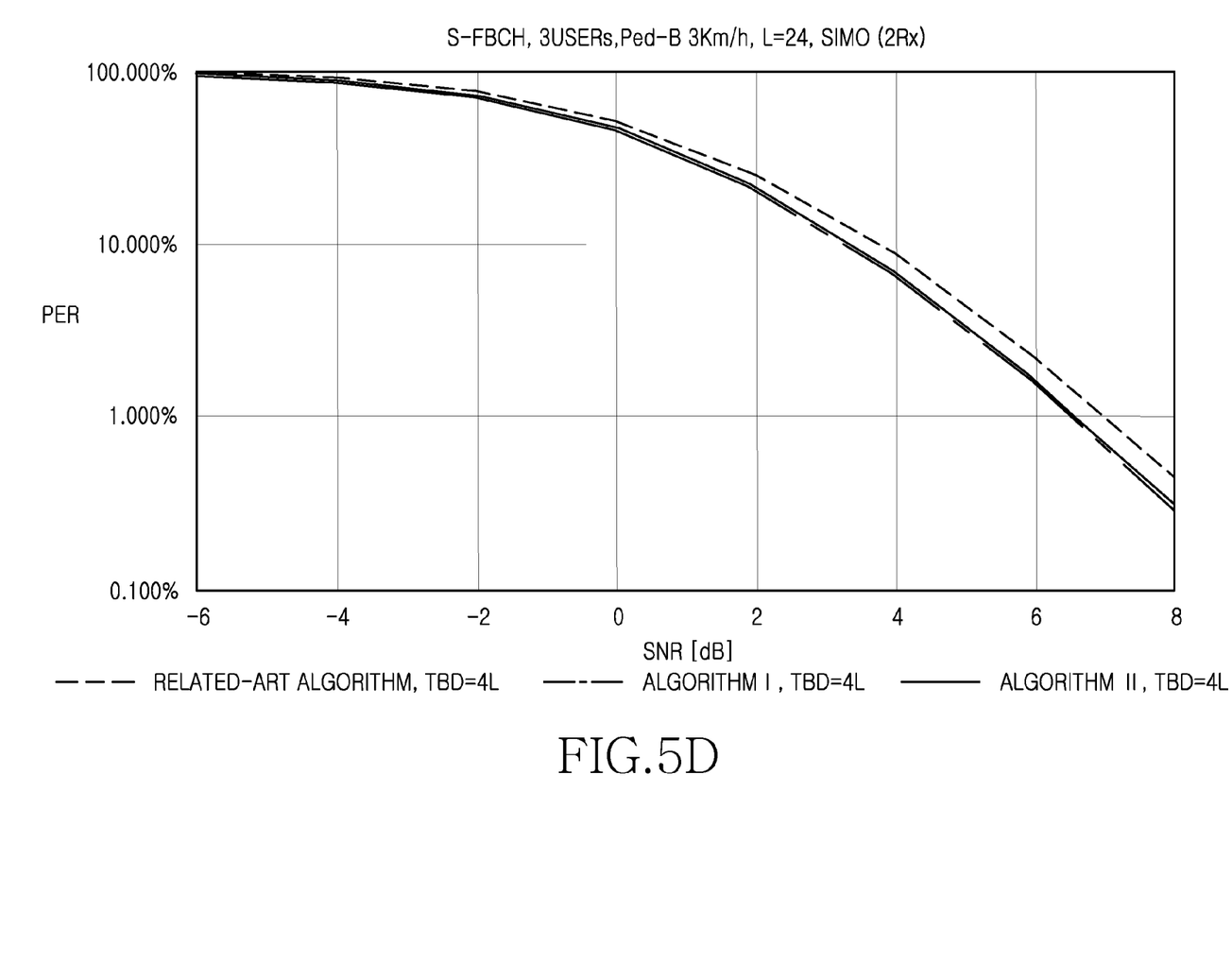

FIG. 4 is a block diagram of a receiving stage in a wireless communication system according to an exemplary embodiment of the present invention.

Referring to FIG. 4, the receiving stage 400 includes a receiver 410, an LLR generator 420, and a decoder 430. The receiver 410 generates soft data of a signal from the signal, which is a Radio Frequency (RF) signal, received over an antenna of the receiver 410. That is, the receiver 410 downconverts the received RF signal into a baseband signal, and generates the soft data by demodulating the baseband signal.

The LLR generator 420 calculates the received signal LLR values using the soft data included in an output signal of the receiver 410. In more detail, the LLR generator 420 calculates the bit-wise LLR values from the soft data by considering a channel condition.

The decoder 430 decodes the bit-wise LLR values output from the LLR generator 420. The decoder 430 divides the bit-wise LLR values according to a codeword and decodes the divided bit-wise LLR values into codewords, and particularly, into a received codeword. For example, the decoder 430 performs the decoding according to the operations as shown in FIG. 3. In further detail, the decoder 430 includes a metric calculator 432, a metric storage 434, a survived path tracer 436, and a bit determiner 438.

The metric calculator 432 calculates path metrics of each of the states in the trellis. In particular, the metric calculator 432 calculates the path metrics up to w-ary windows using the bit-wise LLR values of the codeword. The path metric may be an accumulated value of the branch metrics up to a corresponding state of a corresponding column of the trellis. The branch metric is a value indicating a similarity between a codeword candidate of the corresponding branch and the bit-wise LLR values of the received codeword.

The metric storage 434 stores traceback information used for a survived path search through a traceback generated by the metric calculator 432. The traceback information for the survived path search is stored so as to correspond to each state of the trellis. The receiving stage 400 stores only the traceback information of the states of the last window. That is, the metric storage 434 may include a memory large enough to store only the traceback information of the states of the last window. For example, the traceback information for the survived path search may include at least one of the path metric, a traceback bit, and a quality indication bit of the path metric.

The survived path tracer 436 performs the traceback using the traceback information of the states of the last window, as stored to the metric storage 434. In particular, the survived path tracer 436 repeats the traceback a total of M times within the last window. More specifically, the survived path tracer 436 searches for a path having a maximum path metric in the last column of the trellis, wherein the last column of the trellis is in the last window of the trellis, and conducts the traceback for the L-ary columns from a state of a maximum path metric in the last window of the trellis. In further detail, the survived path tracer 436 performs the traceback from the last state of the previous traceback in the last column of the trellis. The survived path tracer 436 repeats this operation M times.

After the survived path tracer 436 completes the traceback, the bit determiner 438 determines the decoded bits using the states of the survived path of the last traceback. In other words, the bit determiner 438 determines the decoded bits according to the values of the states selected as the survived path in the M-th traceback. In so doing, when the start state and the end state of the traceback are not identical, the bit determiner 438 determines that a decoding failure has occurred. Hence, the bit determiner 438 can discard the corresponding codeword or declare the corresponding codeword to be a result of the decoding failure.

In the present exemplary embodiment, the survived path tracer 436 searches for a state corresponding to the maximum path metric and performs the traceback from the state corresponding to the maximum path metric. Alternatively, it is possible to use an encoder designed to always select a state '0' as the start state. In such a case, the search for the state corresponding to the maximum path metric is omitted, and thus, the survived path tracer 436 can conduct the traceback from the state '0'.

According to the present exemplary embodiment of FIG. 4, the decoding method based on the TBCC has been described. However, the present invention is not limited thereto, and the structure of FIG. 4 may be applied to decode the convolutional code according to other various exemplary embodiments. For example, in the operations of the decoder 430, the determining of whether the start state and the end state are identical can be omitted.

FIGS. 5A through 5D depict a decoding performance in a wireless communication system according to an exemplary embodiment of the present invention.

FIGS. 5A through 5D are graphs showing a Packet Error Rate (PER) versus a Signal to Noise Ratio (SNR) according to a simulation using various information lengths L. In FIGS. 5A through 5D, a related-art algorithm applies the traceback as shown in FIG. 1, a first algorithm applies the traceback as shown in FIG. 2A, and a second algorithm applies the traceback as shown in FIG. 2B. Furthermore, the information length L is 7 in FIG. 5A, the information length L is 12 in FIG. 5B, the information length L is 18 in FIG. 5C, and the information length L is 24 in FIG. 5D.

As seen in FIGS. 5A through 5D, as the information length L increases in the respective figures, the traceback algorithm, according to the present exemplary embodiments, achieves a performance gain as compared to the related-art algorithm that applies the traceback shown in FIG. 1. That is, according to the simulation result of the traceback algorithm of the present exemplary embodiments, the performance of decoding a received signal codeword may be enhanced with the implementation of the TBCC decoder according to the exemplary embodiments of the present invention, and the TBCC decoder may be implemented in a simple manner such that it is not necessary to modify a related-art modem structure.

When a codeword based on the convolutional code or the TBCC is decoded in the communication system, the traceback is iterated a number of times in the last window of the respective code. Therefore, the decoding may be accomplished using a small memory size that stores only the last window of the respective code. Furthermore, since the LLR values are accumulated sufficiently and only the last window is used, a reliability of the decoding result may be enhanced.

While the invention has been shown and described with reference to certain exemplary embodiments thereof, it will be understood by those skilled in the art that various changes in form and details may be made therein without departing from the spirit and scope of the invention as defined by the appended claims and their equivalents.

What is claimed is:

1. A method for decoding bits of a received signal in a communication system, the method comprising:
    determining path metrics of respective states in a trellis corresponding to the received signal;
    selecting a start state in the trellis for a traceback in a last window of the trellis;
    consecutively repeating the traceback at least twice within the last window; and
    determining the decoded bits of the received signal using a survived path of a last traceback after the repeating of the traceback is completed.

2. The method of claim 1, wherein the start state for the traceback is a state of the trellis having a maximum path metric.

3. The method of claim 1, wherein the start state for the traceback is a state having a value of 0.

4. The method of claim 1, further comprising:
    storing traceback information for a traceback corresponding to a current state in the trellis; and
    discarding traceback information for a traceback corresponding to a state in the trellis in a window other than the last window of the trellis.

5. The method of claim 4, wherein the discarding of the traceback information for the traceback corresponding to the state in the window other than the last window comprises overwriting current traceback information with the traceback information corresponding to a state of the last window of the trellis.

6. The method of claim 4, wherein the storing of the traceback information comprises storing no more than traceback information corresponding to one window the trellis.

7. The method of claim 1, wherein the path metrics are determined for each of a plurality of windows, and
    wherein the traceback is repeated as many times as a number of the plurality of the windows.

8. The method of claim 1, wherein the repeating of the traceback from the start state at least twice within the last window comprises performing the traceback from a last state of a previous traceback in a last column of the trellis.

9. The method of claim 1, further comprising determining whether the decoding is successful according to whether a start state and an end state of the traceback are identical after the repeating of the traceback at least twice is completed.

10. The method of claim 9, wherein it is determined that the decoding is not successful if the start state and the end state of the traceback are not identical.

11. An apparatus for decoding bits of a received signal in a communication system, the apparatus comprising:
    a calculator for determining path metrics of respective states in a trellis corresponding to the received signal;
    a tracer for selecting a start state in the trellis for a traceback in a last window of the trellis, and consecutively repeating the traceback at least twice within the last window; and
    a determiner for determining the decoded bits of the received signal using a survived path of a last traceback after the repeating of the traceback is completed.

12. The apparatus of claim 11, wherein the start state for the traceback is a state of the trellis having a maximum path metric.

13. The apparatus of claim 11, wherein the start state for the traceback is a state having a value of 0.

14. The apparatus of claim 11, further comprising a memory for storing traceback information, and discarding the traceback information for a traceback corresponding to states in the trellis in a window other than a state of the trellis of the last window of the trellis.

15. The apparatus of claim 14, wherein the memory overwrites current traceback information with the traceback information corresponding to the state of the last window of the trellis.

16. The apparatus of claim 14, wherein the memory stores no more than traceback information corresponding to one window the trellis.

17. The apparatus of claim 11, wherein the path metrics are determined for each of a plurality of windows, and
    wherein the traceback is repeated as many times as a number of the plurality of the windows.

18. The apparatus of claim 11, wherein the tracer performs the traceback from a last state of a previous traceback in a last column of the trellis.

19. The apparatus of claim 11, wherein the determiner determines whether the decoding is successful according to whether a start state and an end state of the traceback are identical after the repeating of the traceback at least twice is completed.

20. The apparatus of claim 19, wherein it is determined that the decoding is not successful if the start state and the end state of the traceback are not identical.

21. The method of claim 1, wherein the last window comprises fixed path metrics.

22. The apparatus of claim 11, wherein the last window comprises fixed path metrics.

* * * * *